United States Patent
Maxim et al.

(10) Patent No.: US 9,300,260 B2
(45) Date of Patent: Mar. 29, 2016

(54) TRANSFORMER-BASED POWER AMPLIFIER STABILIZATION AND REFERENCE DISTORTION REDUCTION

(71) Applicant: RF Micro Devices, Inc., Greensboro, NC (US)

(72) Inventors: George Maxim, Saratoga, CA (US); Baker Scott, San Jose, CA (US); Ming Tsai, Sunnyvale, CA (US); Alireza Shirvani, Menlo Park, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/215,774

(22) Filed: Mar. 17, 2014

(65) Prior Publication Data

US 2014/0266470 A1    Sep. 18, 2014

Related U.S. Application Data

(60) Provisional application No. 61/789,615, filed on Mar. 15, 2013.

(51) Int. Cl.
*H03F 1/32* (2006.01)
*H03F 3/193* (2006.01)
(Continued)

(52) U.S. Cl.
CPC .......... *H03F 3/193* (2013.01); *H01L 23/49822* (2013.01); *H03F 1/14* (2013.01);
(Continued)

(58) Field of Classification Search
CPC ..... H03F 1/565; H03F 3/68; H03F 2200/537; H03F 1/14; H03F 1/347; H03F 3/193; H03F 3/195; H03F 2200/451; H01L 23/66; H01L 23/49822; H01L 23/49827; H01L 2223/6644; H01L 2224/16225
USPC ............ 330/79, 165, 149, 307, 290, 292, 190
See application file for complete search history.

(56) References Cited

U.S. PATENT DOCUMENTS

| 6,211,738 | B1 | 4/2001 | Hecht |
| 7,355,479 | B2 * | 4/2008 | Van Der Heijden .......... 330/292 |
| 8,912,845 | B2 * | 12/2014 | Jordan .............................. 330/79 |

FOREIGN PATENT DOCUMENTS

WO        2010007177 A1    1/2010

OTHER PUBLICATIONS

Chowdury, D. et al., "Transformer-Coupled Power Amplifier Stability and Power Back-Off Analysis," IEEE Transactions on Circuits and Systems II: Express Briefs, vol. 55, Issue 6, Jun. 2008, IEEE, pp. 507-511.

Dunsmore, Joel et al., "Predicting out-of-band nonlinear power amplifier stability using hot S-parameters," Microwave Engineering Europe, Mar. 2005, pp. 23-28.

(Continued)

*Primary Examiner* — Steven J Mottola
*Assistant Examiner* — Hafizur Rahman
(74) *Attorney, Agent, or Firm* — Withrow & Terranova, P.L.L.C.

(57) ABSTRACT

This disclosure relates generally to radio frequency (RF) amplification devices and methods of operating the same. In one embodiment, an RF amplification device includes an RF amplification circuit and a stabilizing transformer network. The RF amplification circuit defines an RF signal path and is configured to amplify an RF signal propagating in the RF signal path. The stabilizing transformer network is operably associated with the RF signal path defined by the RF amplification circuit. Furthermore, the stabilizing transformer network is configured to reduce parasitic coupling along the RF signal path of the RF amplification circuit as the RF signal propagates in the RF signal path. In this manner, the stabilizing transformer network allows for inexpensive components to be used to reduce parasitic coupling while allowing for smaller distances along the RF signal path.

28 Claims, 9 Drawing Sheets

(51) Int. Cl.
  *H03F 1/14* (2006.01)
  *H03F 1/34* (2006.01)
  *H03F 1/56* (2006.01)
  *H03F 3/195* (2006.01)
  *H01L 23/66* (2006.01)
  *H01L 23/498* (2006.01)
  *H01L 23/00* (2006.01)

(52) U.S. Cl.
  CPC ............... *H03F 1/347* (2013.01); *H03F 1/565* (2013.01); *H03F 3/195* (2013.01); *H01L 23/49827* (2013.01); *H01L 23/66* (2013.01); *H01L 24/16* (2013.01); *H01L 2223/6644* (2013.01); *H01L 2224/16225* (2013.01); *H03F 2200/451* (2013.01)

(56) References Cited

OTHER PUBLICATIONS

Freitag, R.G., "A unified analysis of MMIC power amplifier stability," IEEE MTT-S International Microwave Symposium Digest, vol. 1, Jun. 1-5, 1992, Albuquerque, New Mexico, IEEE, pp. 297-300.
Suarez, A., et al., "Stability Analysis and Stabilization of Power Amplifiers," IEEE Microwave Magazine, vol. 7, Issue 5, Oct. 2006, IEEE, pp. 51-65.
Suarez, A., et al., "Stability analysis of power amplifiers," IEEE International Symposium on Radio-Frequency Integration Technology, Dec. 11-Jan. 9, 2009, Singapore, IEEE, pp. 203-206.
International Search Report and Written Opinion for PCT/US2014/030419, mailed Jun. 23, 2014, 10 pages.
International Preliminary Report on Patentability for PCT/US2014/030419, mailed Sep. 24, 2015, 8 pages.

\* cited by examiner

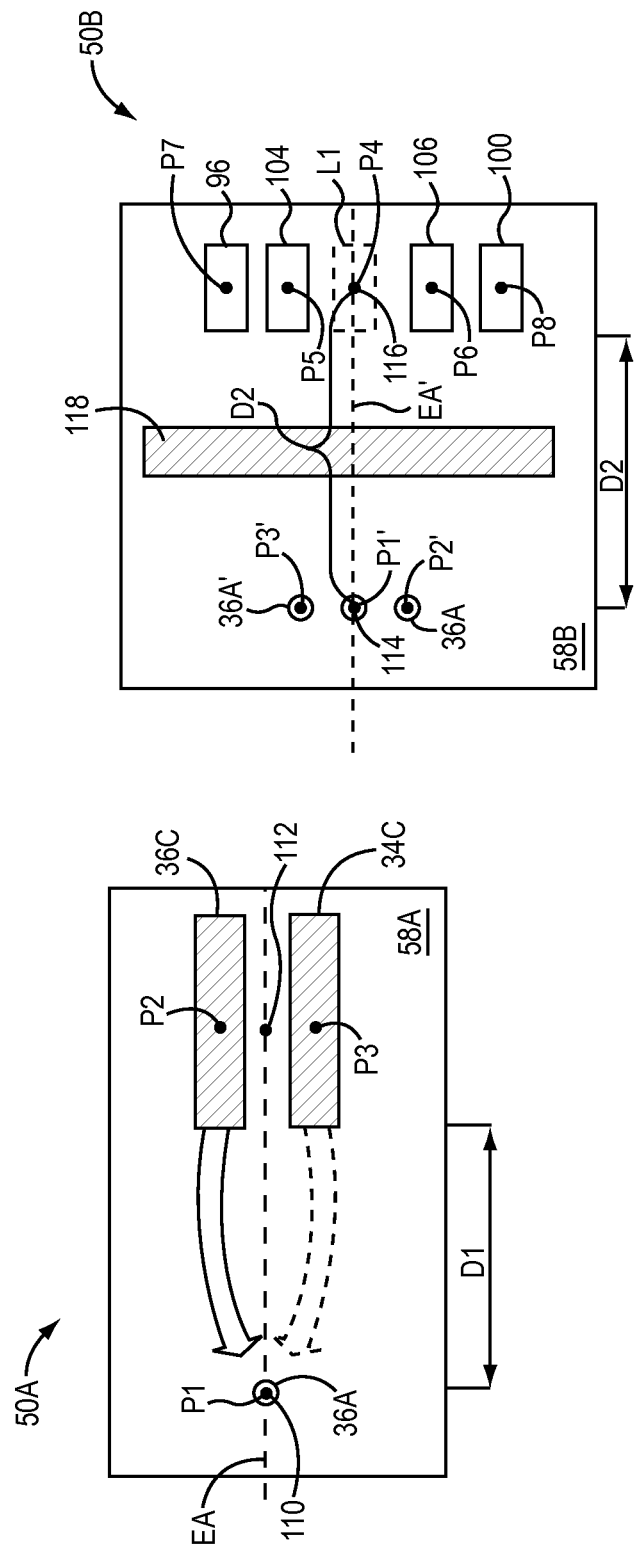

TRANSFORMER-BASED POWER AMPLIFIER STABILIZATION AND REFERENCE DISTORTION REDUCTION

RELATED APPLICATION

This application claims the benefit of U.S. provisional patent application Ser. No. 61/789,615, filed Mar. 15, 2013, the disclosure of which is incorporated herein by reference in its entirety.

FIELD OF THE DISCLOSURE

This disclosure relates generally to radio frequency (RF) amplification devices and methods of operating the same.

BACKGROUND

Radio frequency (RF) amplification devices are used in RF front-end circuitry in order to amplify RF signals. Typically, an RF amplification device includes an RF amplification circuit that defines an RF signal path. The RF amplification circuit is configured to amplify an RF signal as the RF signal propagates in the RF signal path. One of the problems with RF amplification devices comes from parasitic coupling in the RF signal path. As the RF signal propagates in the RF signal path, the RF signal path causes parasitic coupling. In related art, RF amplification devices have reduced parasitic coupling by increasing distances in the RF signal path and/or by using more advanced, expensive assembly processes that strive to minimize parasitic inductances in the ground and supply connections. Unfortunately, as RF amplification devices become smaller, increasing distances in the RF signal path is becoming a less attractive option. Furthermore, advanced, expensive assembly processes are becoming less practical as costs go up due to miniaturization. Accordingly, less expensive techniques to reduce parasitic magnetic coupling are needed that rely less on increasing distances along the RF signal path.

SUMMARY

This disclosure relates generally to radio frequency (RF) amplification devices and methods of operating the same. In one embodiment, an RF amplification device includes an RF amplification circuit and a stabilizing transformer network. The RF amplification circuit defines an RF signal path and is configured to amplify an RF signal propagating in the RF signal path. The stabilizing transformer network is operably associated with the RF signal path defined by the RF amplification circuit. Furthermore, the stabilizing transformer network is configured to reduce parasitic coupling along the RF signal path of the RF amplification circuit as the RF signal propagates in the RF signal path. In this manner, the stabilizing transformer network allows for inexpensive components to be used to reduce parasitic coupling while allowing for shorter distances along the RF signal path.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 9A illustrates an embodiment of a Back End of Line (BEOL) of a semiconductor die used with the stabilizing transformer network shown in FIG. 5.

FIG. 9B illustrates an embodiment of a BEOL of a semiconductor die used with the stabilizing transformer network shown in FIG. 8.

DETAILED DESCRIPTION

Figure 1:
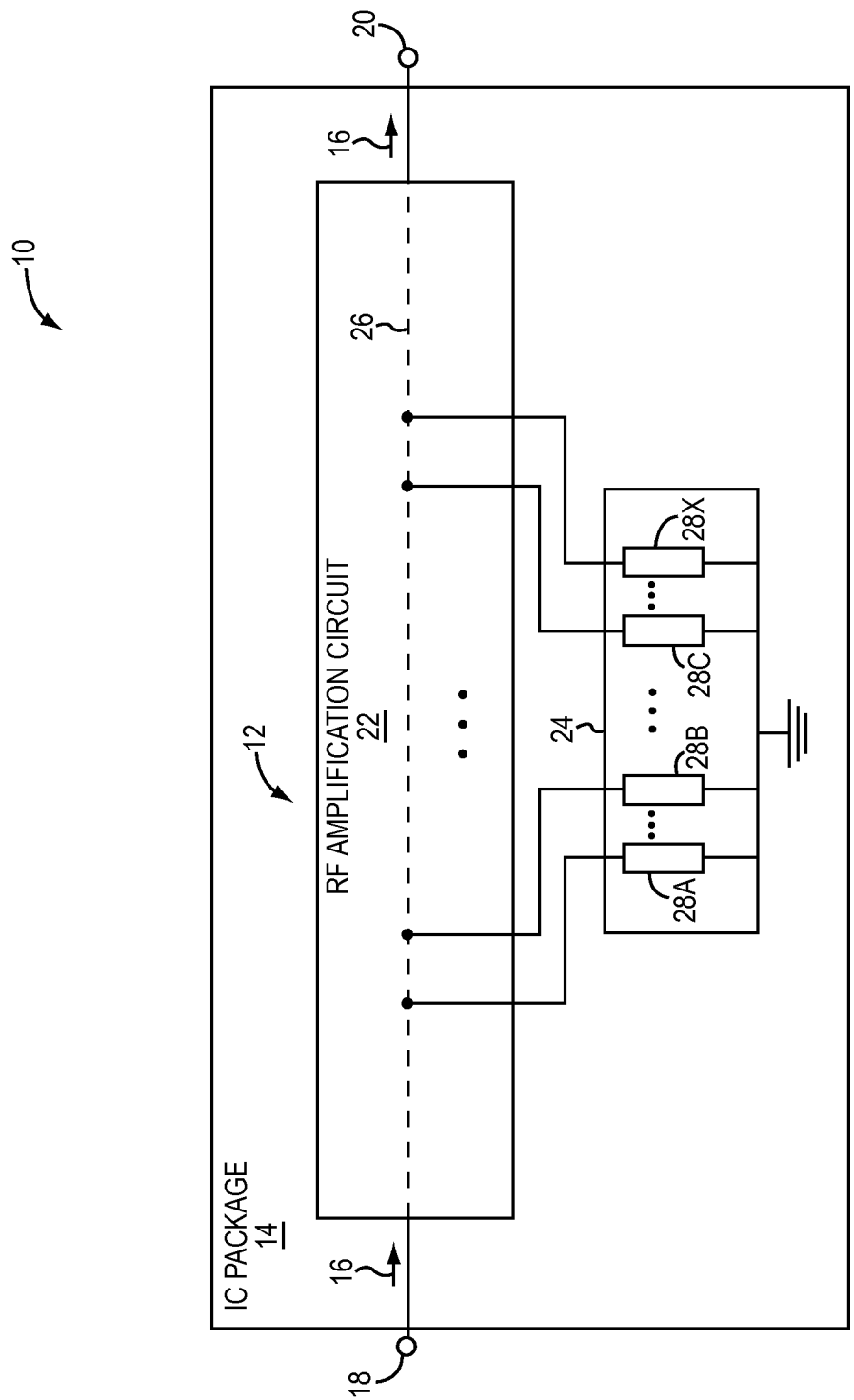
FIG. 1 illustrates one embodiment of a radio frequency (RF) amplification device that includes an exemplary RF amplification circuit and an exemplary stabilizing transformer network, wherein the RF amplification device is integrated into an integrated circuit (IC) package.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship between one element, layer, or region and another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that when used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In FIG. 1, an exemplary radio frequency (RF) amplification device 12 is provided in an integrated circuit (IC) package 14. The RF amplification device 12 may be connected between upstream RF system circuitry (not shown) and downstream RF system circuitry (not shown) within an RF communications system (not shown). For example, the upstream RF system circuitry, the RF amplification device 12, and the downstream RF system circuitry may be or may be part of either transmit chain(s) or receive chain(s) within the RF communications system. In one embodiment, the RF communications system is an RF transceiver and the upstream RF system circuitry, the RF amplification device 12, and the downstream RF system circuitry may be provided so as to form one or multiple transmit chains of the RF transceiver. As such, the RF communications system may be provided in a user communication device, such as a laptop, a cellular phone, a tablet, a personal computer, or the like. In the transmit chain, the upstream RF system circuitry may include baseband circuitry and up-conversion circuitry that generate an RF signal 16.

The IC package 14 houses the RF amplification device 12 and allows the RF amplification device 12 to transmit and receive signals externally from the IC package 14. As shown in FIG. 1, the IC package 14 includes a package input terminus 18, which may be coupled to the upstream RF system circuitry so that the RF amplification device 12 receives the RF signal 16. As such, the RF signal 16 is exogenous to the IC package 14. In the transmit chain(s), the RF amplification device 12 is configured to provide amplification prior to transmission by the downstream RF system circuitry from an antenna (not shown). As such, the RF amplification device 12 is configured to receive and amplify the RF signal 16. Once the RF signal 16 has been amplified, the RF signal 16 is exogenously transmitted from the IC package 14 at a package output terminus 20 to the downstream RF system circuitry. The package output terminus 20 transmits the RF signal 16 to the downstream RF system circuitry.

The RF signal 16 may be provided within different RF communication bands, may be formatted in accordance with different RF communication standards, and/or may be formatted in accordance with different RF communication specifications within those RF communication standards. Exemplary RF communication standards and specifications include a 2G Global System for Mobile Communications (GSM) standard (e.g., a Digital Communication System (DCS) specification or a Personal Communications Service (PCS) specification), GSM specifications, Enhanced Data Rates for GSM Evolution (EDGE) specifications of the 3G standard, and/or different specifications of the Long Term Evolution (LTE) standard. Furthermore, the RF signal 16 may be multiplexed in accordance with Time Division Duplex (TDD) techniques, Frequency Division Duplex (FDD) techniques, Space Division Multiplexing (SDM), Code Division Multiple Access (CDMA) multiplexing, Orthogonal Frequency Division Multiple Access (OFDMA) multiplexing, LTE diversity techniques, Multiple-Input and Multiple-Output (MIMO) techniques, and/or the like. The RF amplification device 12 may be configured to provide amplification to the RF signal 16 when the RF signal 16 is provided in one or more RF communication bands, when the RF signal 16 is formatted in accordance with one or more of the RF communication standards, and/or when the RF signal 16 is formatted in accordance with one or more of the RF communication specifications within those RF communication standards The RF amplification device 12 shown in FIG. 1 includes an RF amplification circuit 22 and a stabilizing transformer network 24. Thus, the RF amplification circuit 22 and the stabilizing transformer network 24 are provided within the IC package 14. The RF amplification circuit 22 and the stabilizing transformer network 24 may have independent components or may share components as explained in further detail below. With regard to the RF amplification circuit 22, the RF amplification circuit 22 is configured to receive the RF signal 16 from the package input terminus 18. As shown in FIG. 1, the RF amplification circuit 22 defines an RF signal path 26 between the package input terminus 18 and the package output terminus 20. The RF amplification device 12 is configured so that the RF signal 16 propagates through the RF signal path 26 defined by the RF amplification circuit 22. More specifically, the RF amplification circuit 22 shown in FIG. 1 is configured to amplify the RF signal 16 propagating in the RF signal path 26. Once the RF signal 16 has been amplified, the RF amplification circuit 22 outputs the RF signal 16 and the RF signal 16 is transmitted to the package output terminus 20. In some embodiments, the RF amplification circuit 22 is divided into RF amplifier stages that are provided within the RF signal path 26. The RF amplification circuit 22 may be realized with discrete components in one or multiple integrated circuits and substrate materials. Additionally, the RF amplification circuit 22 may include additional passive and/or active components. Alternatively, the RF amplification circuit 22 may be provided as having a single RF amplifier stage provided within the RF signal path 26. Other circuitry, such as RF filters, and electronic components may be provided in and/or connected to the RF signal path 26 within the RF amplification circuit 22.

To maintain the efficiency of the RF amplification circuit 22, the RF signal path 26 should be stabilized and protected from distortion. However, the propagation of the RF signal 16 in the RF signal path 26 may cause the RF signal path 26 to generate an electromagnetic field that results in parasitic coupling along the RF signal path 26. Similarly, signal reflections due to impedances presented in the RF signal path 26 may cause parasitic coupling. If corrective measures are not taken, this parasitic coupling can result in parasitic feedback (i.e., positive parasitic feedback and/or negative parasitic feedback) that can result in distortion and/or may destabilize the operation of the RF amplification circuit 22.

As such, the RF amplification device 12 includes the stabilizing transformer network 24 operably associated with the RF signal path 26 of the RF amplification circuit 22. The stabilizing transformer network 24 is configured to reduce the parasitic coupling along the RF signal path 26. For example, as the RF signal 16 propagates in the RF signal path 26, the stabilizing transformer network 24 may be responsive to the electromagnetic field generated by the RF signal path 26 so as to reduce the parasitic coupling along the RF signal path 26. Additionally, the stabilizing transformer network 24 may be configured to set the impedances seen along the RF signal path 26 so as to reduce parasitic coupling caused by signal reflections.

In the embodiment shown in FIG. 1, the stabilizing transformer network 24 includes inductive elements (referred to generically as elements 28 and specifically as elements 28A-28X) operably associated with the RF signal path 26. The inductive elements 28 in the stabilizing transformer network 24 are mutually coupled such that the inductive elements 28 reduce the parasitic coupling along the RF signal path 26 in response to the electromagnetic field. The inductive elements 28 of the stabilizing transformer network 24 may also be mutually coupled so as to reduce effective inductances presented along the RF signal path 26, thereby reducing the parasitic coupling caused by signal reflections. The inductive elements 28 may be operably associated with the RF signal path 26 in any manner. For example, the inductive elements 28 may be connected in shunt with respect to the RF signal path 26 and/or may be connected in series within the RF signal path 26. An integer number X of the inductive elements 28 may be provided where the integer number X is greater than one (1).

It should be noted that the inductive elements 28 may be any type of element having an inductance. Thus, while the inductive elements 28 may be inductors (e.g., inductor coils), the inductive elements 28 may be any type of conductive components, such as passive conductive components like conductive vias, conductive paths, conductive pads, conductive layers, wires, traces, or pins. Furthermore, it should also be noted that the inductive elements 28 may be exclusively built for the stabilizing transformer network 24, or instead, the inductive elements 28 may be components that serve additional purposes in the RF amplification device 12. For example, the inductive elements 28 may be provided by grounding vias (not shown) and/or may be portions of the RF signal path 26.

In one embodiment, the stabilizing transformer network 24 shown in FIG. 1 may be realized with only two inductive elements 28 that are mutually coupled. In another embodiment, the stabilizing transformer network 24 may be a multi-section transformer having more than two inductive elements 28 that are mutually coupled. In some embodiments, the inductive elements 28 in the stabilizing transformer network 24 may provide common connections to ground or different connections to ground. In yet other embodiments, the stabilizing transformer network 24 may be partially or completely built in the RF amplification circuit 22. In still other embodiments, the stabilizing transformer network 24 may have multiple transformers, each with two or more inductors. It should be noted that any combination of the above-described configurations can be used to realize the stabilizing transformer network 24.

Figure 2:
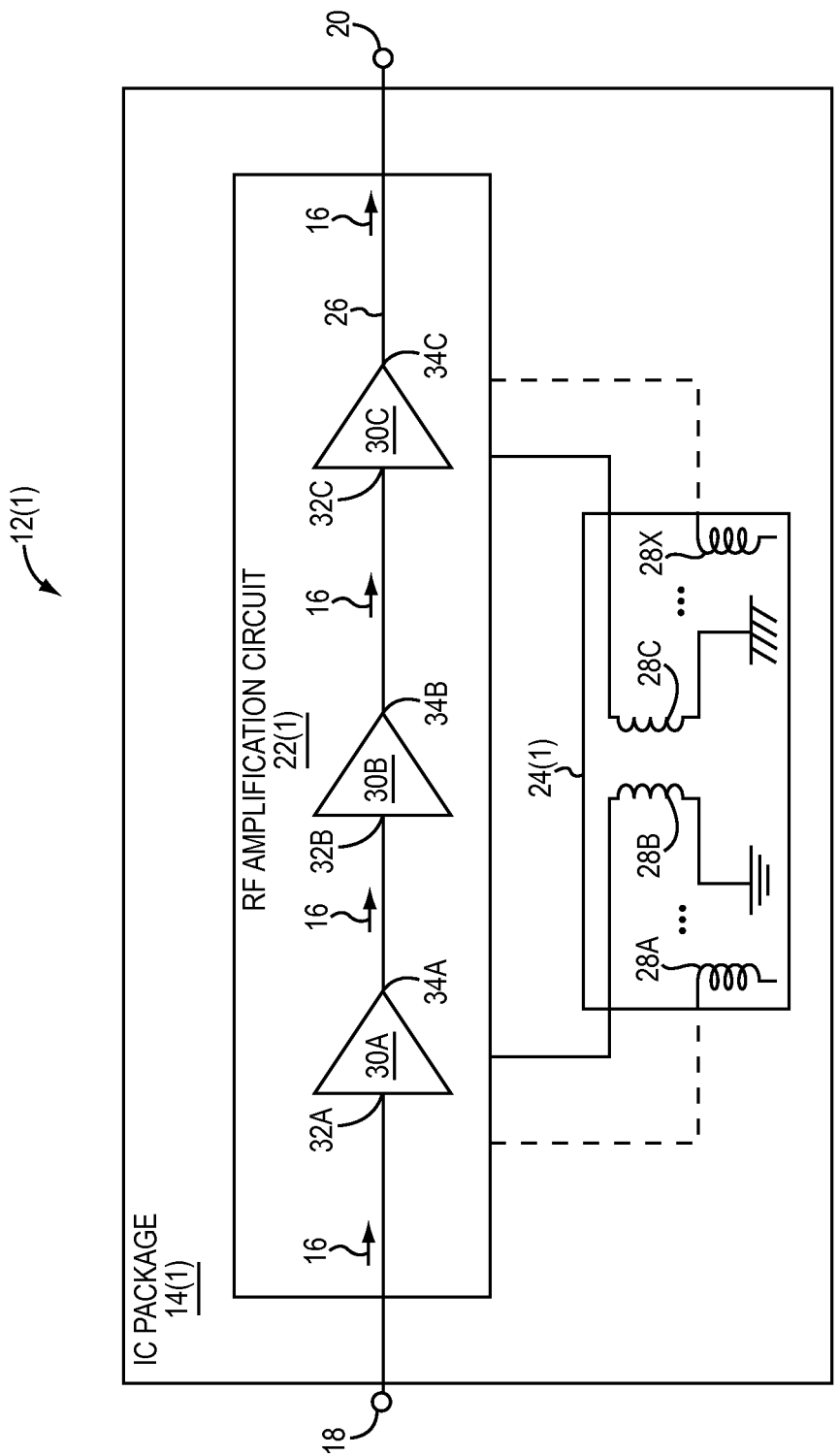
FIG. 2 illustrates one embodiment of the RF amplification device and one embodiment of the IC package shown in FIG. 1, wherein the RF amplification circuit includes an initial RF amplifier stage, an intermediate RF amplifier stage, and a final RF amplifier stage.

FIG. 2 illustrates an exemplary RF amplification device 12(1) integrated into an exemplary IC package 14(1). The RF amplification device 12(1) is one embodiment of the RF amplification device 12 described above with respect to FIG. 1 and the IC package 14(1) is one embodiment of the IC package 14 shown in FIG. 1. In this embodiment, the RF amplification device 12(1) includes an exemplary RF amplification circuit 22(1), which is one embodiment of the RF amplification circuit 22 shown in FIG. 1. The RF amplification device 12(1) also includes an exemplary stabilizing transformer network 24(1), which is one embodiment of the stabilizing transformer network 24 described above with respect to FIG. 1.

With regard to the RF amplification circuit 22(1), the RF amplification circuit 22(1) includes a plurality of RF amplifier stages (referred to generically as element 30 and specifically as elements 30A-30C) coupled in cascade. The RF amplifier stages 30 are connected within the RF signal path 26 so as to amplify the RF signal 16 as the RF signal 16 propagates along the RF signal path 26. In other words, by being connected in cascade, the RF amplifier stages 30 provide amplification to the RF signal 16 in sequence. The RF amplification circuit 22(1) shown in FIG. 2 has an initial RF amplifier stage 30A, an intermediate RF amplifier stage 30B, and a final RF amplifier stage 30C. However, other embodiments of the RF amplification circuit 22(1) may include any number of RF amplifier stages 30 greater than or equal to one (1). The initial RF amplifier stage 30A is the RF amplifier stage 30 at a beginning of the sequence within the RF signal path 26. The final RF amplifier stage 30C is the RF amplifier stage 30 at an end of the sequence within the RF signal path 26. In the embodiment illustrated in FIG. 2, the RF amplification circuit 22(1) has three RF amplifier stages 30. Thus, the single intermediate RF amplifier stage 30B is coupled within the RF signal path 26 in cascade between the initial RF amplifier stage 30A and the final RF amplifier stage 30C. However, as mentioned above, the number of RF amplifier stages 30 may be any integer greater than or equal to one (1), and thus the number of RF amplifier stages 30 may be greater than three (3). As such, there may be any number of intermediate RF amplifier stages, like the intermediate RF amplifier stage 30B, coupled in cascade between the initial RF amplifier stage 30A and the final RF amplifier stage 30C.

Since the RF amplifier stages 30 are connected in cascade within the RF signal path 26, the RF amplifier stages 30 provide amplification to the RF signal 16 in sequence as the RF signal 16 propagates along the RF signal path 26. Accordingly, the initial RF amplifier stage 30A initially provides amplification to the RF signal 16 in accordance with an amplifier gain $G_{initial}$. Once the RF signal 16 is amplified by the initial RF amplifier stage 30A in accordance with the amplifier gain $G_{initial}$, the intermediate RF amplifier stage 30B amplifies the RF signal 16 in accordance with an amplifier gain $G_{intermediate}$. Once the RF signal 16 is amplified by the intermediate RF amplifier stage 30B in accordance with the amplifier gain $G_{intermediate}$, the final RF amplifier stage 30C amplifies the RF signal 16 in accordance with an amplifier gain $G_{final}$. As such, an amplifier gain $G_{AMP}$ of the RF amplification circuit 22(1) is an aggregated amplifier gain (i.e., $G_{initial}*G_{intermediate}*G_{final}$) of the plurality of RF amplifier stages 30.

In another embodiment, a combination of single-ended and differential termini may be provided in the RF signal path 26 by the RF amplifier stages 30. In still other embodiments, some RF amplifier stages 30 have single-ended input/output and differential input/output.

As shown in FIG. 2, the initial RF amplifier stage 30A has an amplifier input terminus 32A and an amplifier output terminus 34A. The intermediate RF amplifier stage 30B has an amplifier input terminus 32B and an amplifier output terminus 34B. The final RF amplifier stage 30C has an amplifier input terminus 32C and an amplifier output terminus 34C. In this embodiment, the RF amplification circuit 22(1) is illustrated as receiving the RF signal 16 as a single-ended signal. The RF signal path 26 is thus a single-ended signal path and each of the RF amplifier stages 30 are single-ended RF amplifier stages. Thus, the amplifier input termini 32A, 32C, 32C and the amplifier output termini 34A, 34B, 34C may each be a single-ended terminal or node. However, in alternative embodiments, the RF signal 16 may be received as a differential signal and the RF signal path 26 may be a differential signal path. As such, in these alternative embodiments, the RF amplifier stages 30 may be differential RF amplifier stages. Thus, the amplifier input termini 32A, 32C, 32C and the amplifier output termini 34A, 34B, 34C may each be a pair of terminals or nodes configured to receive and/or transmit differential signals.

The RF signal path 26 defined by the RF amplification circuit 22(1) begins at the package input terminus 18. The IC package 14(1) receives the RF signal 16 exogenously at the package input terminus 18. As such, the RF amplification circuit 22(1) is configured to receive the RF signal 16 from upstream RF system circuitry. The amplifier input terminus 32A is coupled within the RF signal path 26 to receive the RF signal 16 from the package input terminus 18. As such, the RF signal 16 propagates along the RF signal path 26 to the amplifier input terminus 32A of the initial RF amplifier stage 30A. The initial RF amplifier stage 30A is configured to amplify the RF signal 16 in accordance with the amplifier gain $G_{initial}$. Once the initial RF amplifier stage 30A has provided amplification to the RF signal 16 in accordance with the amplifier gain $G_{initial}$, the initial RF amplifier stage 30A transmits the RF signal 16 from the amplifier output terminus 34A, which is within the RF signal path 26. The RF signal 16 then propagates from the amplifier output terminus 34A of the initial RF amplifier stage 30A along the RF signal path 26. The intermediate RF amplifier stage 30B is configured to receive the RF signal 16 at the amplifier input terminus 32B, which is also within the RF signal path 26. The intermediate RF amplifier stage 30B amplifies the RF signal 16 in accordance with the amplifier gain $G_{intermediate}$. Once the intermediate RF amplifier stage 30B amplifies the RF signal 16 in accordance with the amplifier gain $G_{intermediate}$, the intermediate RF amplifier stage 30B transmits the RF signal 16 from the amplifier output terminus 34B. The amplifier output terminus 34B is in the RF signal path 26. Thus, the RF signal 16 propagates from the amplifier output terminus 34B of the intermediate RF amplifier stage 30B along the RF signal path 26. The final RF amplifier stage 30C then receives the RF signal 16 at the amplifier input terminus 32C, which is also within the RF signal path 26. The final RF amplifier stage 30C amplifies the RF signal 16 in accordance with the amplifier gain $G_{final}$. Once the final RF amplifier stage 30C has provided amplification to the RF signal 16 in accordance with the amplifier gain $G_{final}$, the final RF amplifier stage 30C transmits the RF signal 16 from the amplifier output terminus 34C. The amplifier output terminus 34C is within the RF signal path 26. The RF signal 16 then propagates from the amplifier output terminus 34C of the final RF amplifier stage 30C along the RF signal path 26 to the package output terminus 20. The RF signal 16 may then be transmitted exogenously at the package output terminus 20 to downstream RF system circuitry. Thus, the package output terminus 20 is at an end of the RF signal path 26 defined by the RF amplification circuit 22(1).

Note that as the RF signal 16 progresses through the sequence, each of the RF amplifier stages 30 handles an increasing amount of power. Therefore, the initial RF amplifier stage 30A handles the least amount of power, since it receives the RF signal 16 prior to amplification and transmits the RF signal 16 amplified only in accordance with the amplifier gain $G_{initial}$. When the intermediate RF amplifier stage 30B receives the RF signal 16, the RF signal 16 has already been amplified by the amplifier gain $G_{initial}$. The intermediate RF amplifier stage 30B further amplifies the RF signal 16 in accordance with the amplifier gain $G_{intermediate}$. Thus, the intermediate RF amplifier stage 30B transmits the RF signal 16 amplified in accordance with an aggregate amplifier gain of $G_{initial}*G_{intermediate}$. As a result, the intermediate RF amplifier stage 30B handles an intermediate amount of power. The final RF amplifier stage 30C receives the RF signal 16 amplified in accordance with the aggregate amplifier gain of $G_{initial}*G_{intermediate}$. As such, when the final RF amplifier stage 30C further amplifies the RF signal 16 by the amplifier gain $G_{final}$, the final RF amplifier stage 30C transmits the RF signal 16 amplified in accordance with the aggregate amplifier gain of $G_{initial}*G_{intermediate}*G_{final}$. As such, the final RF amplifier stage 30C handles the most power.

Each RF amplifier stage 30 is configured to provide amplification so that it may handle the appropriate power levels. For example, each of the RF amplifier stages 30 may include a transistor, a network of transistors, op-amps, and/or any other type of suitable RF amplification component. Other types of active and/or passive components may also be provided in the RF amplifier stages 30. Often, the initial RF amplifier stage 30A and the intermediate RF amplifier stage 30B are classified as "driver" RF amplifier stages 30. In some embodiments, each of the driver RF amplifier stages 30 may have a single transistor or a pair of transistors to provide amplification. However, since the final RF amplifier stage 30C handles the most power, some embodiments of the final RF amplifier stage 30C may include arrays of transistors or stacks of transistors in order to handle the power levels seen by the final RF amplifier stage 30C.

Both or either electric and mutual magnetic coupling may be present between the RF amplifier stages 30. The mutual electric coupling can be reduced through layout techniques that minimize parasitic coupling. The mutual magnetic coupling can be difficult to eliminate, particularly in compact assemblies. Utilizing the techniques described herein, devices, techniques, and methods of cancelling magnetic mutual coupling, rather than simply reducing or minimizing magnetic mutual coupling, can be realized. Mutual coupling between the final RF amplifier stage 30C having a large signal and the initial RF amplifier stage 30A having a small signal is generally the most problematic.

The propagation of the RF signal 16 results in parasitic coupling in the RF signal path 26. Since the power levels increase between each of the RF amplifier stages 30, the parasitic coupling can destabilize the RF amplifier stages 30 if not corrected. For example, an electromagnetic field emitted by the RF signal path 26 may cause parasitic magnetic coupling from the final RF amplifier stage 30C to the intermediate RF amplifier stage 30B and/or to the initial RF amplifier stage 30A. The parasitic magnetic coupling may result in positive feedback and/or negative feedback between the final RF amplifier stage 30C and the intermediate RF amplifier stage 30B and/or between the final RF amplifier stage 30C and the initial RF amplifier stage 30A. Since the power levels of the final RF amplifier stage 30C are high, the parasitic magnetic coupling can destabilize the intermediate RF amplifier stage 30B and/or the initial RF amplifier stage 30A. If uncorrected, the electromagnetic field could thus destabilize the RF amplification circuit 22(1). To provide another example of parasitic coupling, impedances presented by the final RF amplifier stage 30C can cause signal reflections that result in parasitic electric coupling (i.e., parasitic capacitive coupling) between the final RF amplifier stage 30C and the intermediate RF amplifier stage 30B. The parasitic electric coupling may also cause positive feedback and/or negative feedback and thus destabilize the intermediate RF amplifier stage 30B if uncorrected.

To help stabilize the RF amplification circuit 22(1) and/or decrease distortion, the stabilizing transformer network 24(1) is operably associated with the RF signal path 26 of the RF amplification circuit 22(1) and is configured to reduce the parasitic coupling along the RF signal path 26 as the RF signal 16 propagates in the RF signal path 26. For example, magnetic coupling cancellation may be provided. As such, if a certain parasitic magnetic coupling exists between two points in the RF signal path 26, the stabilizing transformer network 24(1) provides a magnetic coupling in opposition that may cancel the parasitic magnetic coupling. In particular, the inductive elements 28 in the stabilizing transformer network 24(1) are operably associated with the RF signal path 26 and are mutually coupled so as to reduce the parasitic coupling along the RF signal path 26. For example, the stabilizing transformer network 24(1) may be responsive to the electromagnetic field generated by the RF signal path 26 so as reduce the parasitic magnetic coupling along the RF signal path 26. In this case, a set of two or more of the inductive elements 28 may be mutually coupled so as to oppose the parasitic magnetic coupling from the final RF amplifier stage 30C to the intermediate RF amplifier stage 30B and/or to the initial RF amplifier stage 30A in response to the electromagnetic field. The set of inductive elements 28 may thus partially negate or completely eliminate the parasitic magnetic coupling. With regard to parasitic electric coupling, a set of two or more of the inductive elements 28 may be mutually coupled so as to reduce an effective inductance presented in the RF signal path 26.

Figure 3:
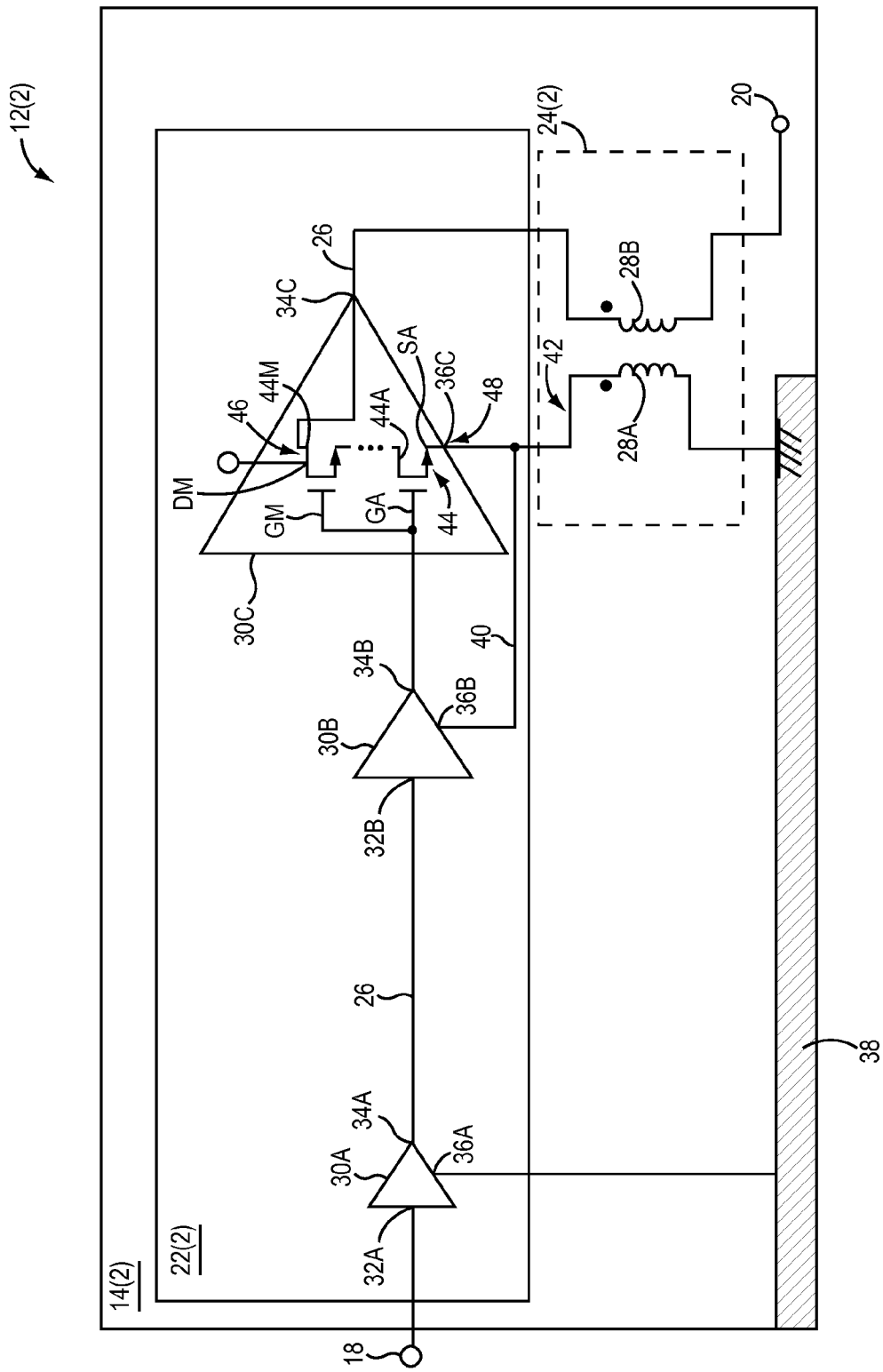
FIG. 3 illustrates one embodiment of the RF amplification device shown in FIG. 2, wherein the stabilizing transformer network includes a grounding element and a connection element connected to the final RF amplifier stage.

FIG. 3 illustrates an exemplary RF amplification device 12(2), which is one embodiment of the RF amplification device 12(1) described above with respect to FIG. 2. The RF amplification device 12(2) includes an RF amplification circuit 22(2) and a stabilizing transformer network 24(2). The RF amplification circuit 22(2) is one embodiment of the RF amplification circuit 22(1), shown in FIG. 2. The RF amplification circuit 22(2) thus includes one embodiment of the initial RF amplifier stage 30A, one embodiment of the intermediate RF amplifier stage 30B, and one embodiment of the an final RF amplifier stage 30C.

The RF amplification device 12(2) is integrated into an IC package 14(2), which is one embodiment of the IC package 14(1) shown in FIG. 2. In this embodiment, the initial RF amplifier stage 30A includes the amplifier input terminus 32A, the amplifier output terminus 34A, and a grounding terminus 36A. The initial RF amplifier stage 30A is provided within the RF signal path 26. The grounding terminus 36A is independently connected to a grounding plate 38 provided by the IC package 14(2). With regard to the intermediate RF amplifier stage 30B, the intermediate RF amplifier stage 30B includes the amplifier input terminus 32B, the amplifier output terminus 34B, and a grounding terminus 36B. The intermediate RF amplifier stage 30B is provided within the RF signal path 26. A connection path 40 connects the grounding terminus 36B to a shunt path 42 connected to the grounding plate 38. Accordingly, the connection path 40 is connected between the grounding terminus 36B and the shunt path 42. The connection path 40 and the shunt path 42 thus connect the intermediate RF amplifier stage 30B to ground. However, the shunt path 42 is not independent, but rather is shared with the final RF amplifier stage 30C.

In this embodiment, the final RF amplifier stage 30C is formed from a stack of transistors (referred to generically as elements 44 and specifically as 44A-44M). The stack of the transistors 44 that form the final RF amplifier stage 30C is a stack of field effect transistors (FETs). An integer number M of the transistors 44 are stacked within the final RF amplifier stage 30C, where the integer number M is greater than one (1). Alternatively, the final RF amplifier stage 30C may have a non-stacked configuration, for example, if a single amplifying component were provided. Referring again to the embodiment shown in FIG. 3, the final RF amplifier stage 30C is configured so that the stack of the transistors 44 amplifies the RF signal 16. As shown in FIG. 3, the final RF amplifier stage 30C includes the amplifier input terminus 32C, the amplifier output terminus 34C, and a grounding terminus 36C. In this embodiment, each gate (referred to generically as elements G and specifically as GA-GM) of the transistors 44 is connected to the amplifier input terminus 32C. In this manner, the final RF amplifier stage 30C is configured so that the stack of the transistors 44 amplifies the RF signal 16. A drain DM of a transistor 44M at a first end 46 of the stack of the transistors 44 is connected to the amplifier output terminus 34C. Thus, the final RF amplifier stage 30C is provided within the RF signal path 26. An RF source SA of a transistor 44A at a second end 48 of the stack of the transistors 44 is connected to the grounding terminus 36C. The grounding terminus 36C is connected to the grounding plate 38.

As the RF signal 16 propagates in the RF signal path 26, the RF signal 16 can cause parasitic coupling along the RF signal path 26. For example, the RF signal 16 can cause parasitic coupling between the final RF amplifier stage 30C and the intermediate RF amplifier stage 30B. In this embodiment, the grounding terminus 36C is connected to the shunt path 42 that connects to ground (e.g., the grounding plate 38). In this manner, the intermediate RF amplifier stage 30B and the final RF amplifier stage 30C share the shunt path 42 to ground. This may be a result of there being a limited number of paths to ground provided by the IC package 14(2).

However, an inductance in the shared shunt path 42 to ground can cause parasitic electric coupling between the final RF amplifier stage 30C and the intermediate RF amplifier stage 30B. In particular, due to the inductance of the shunt path 42, the shunt path 42 can result in signal reflections (i.e., signal voltage drop due to a ground inductance) that propagate to the intermediate RF amplifier stage 30B through the connection path 40. This parasitic electric coupling causes positive feedback between the intermediate RF amplifier stage 30B and the final RF amplifier stage 30C, which can cause gain expansion and eventually destabilize the RF amplification circuit 22(2) if uncorrected. The voltage on the ground inductance results in positive feedback between the intermediate RF amplifier stage 30B and the final RF amplifier stage 30C.

To help stabilize the RF amplification circuit 22(1), the inductive element 28A in the stabilizing transformer network 24(2) provides the shared shunt path 42 to the grounding plate 38 for the final RF amplifier stage 30C and the intermediate RF amplifier stage 30B. Thus, both the grounding terminus 36C and the grounding terminus 36B are connected by the inductive element 28A to ground. In this embodiment, the inductive element 28A is a grounding element provided by the IC package 14(2). The inductive element 28A has a self-inductance, which is higher than an equivalent inductance presented to the intermediate RF amplifier stage 30B at the grounding terminus 36B and to the final RF amplifier stage 30C at the grounding terminus 36C.

To do this, the inductive element 28A is mutually coupled to the inductive element 28B in the stabilizing transformer network 24(2) such that the parasitic electric coupling between the final RF amplifier stage 30C and the intermediate RF amplifier stage 30B is reduced. More specifically, the inductive element 28A is mutually coupled to the inductive element 28B in opposition. Thus, a mutual inductance provided by the inductive element 28B decreases the equivalent inductance presented to the intermediate RF amplifier stage 30B at the grounding terminus 36B and to the final RF amplifier stage 30C at the grounding terminus 36B below the self-inductance of the inductive element 28A. Since the equivalent inductance has been decreased, the signal reflections are reduced, and therefore the parasitic electric coupling is reduced. In this embodiment, an output current has an opposite direction to a ground current.

Referring again to the stabilizing transformer network 24(2), the inductive element 28B is a conductive element in the RF signal path 26 coupled between the amplifier output terminus 34C and the package output terminus 20. The inductive element 28B also has a self-inductance. However, the inductive element 28B is mutually coupled to the inductive element 28A in opposition, and therefore a coupling factor between the inductive element 28B and the inductive element 28A is negative. The mutual inductance between the inductive element 28B and the inductive element 28A thus is presented negatively at the inductive element 28A, thereby reducing the equivalent inductance of the inductive element 28A below the self-inductance of the inductive element 28A. As such, the parasitic electric coupling (which results in positive feedback) between the final RF amplifier stage 30C and the intermediate RF amplifier stage 30B is reduced.

Furthermore, as the RF signal 16 propagates along the RF signal path 26, an electromagnetic field is generated by the RF signal path 26, which can cause parasitic magnetic coupling along the RF signal path 26. For instance, the electromagnetic field may cause parasitic magnetic coupling between final RF amplifier stage 30C and the intermediate RF amplifier stage 30B. Additionally, the parasitic magnetic coupling can cause parasitic coupling to the initial RF amplifier stage 30A, which usually has the lowest power levels of the RF signal 16 and thus is more sensitive. The parasitic magnetic coupling between the final RF amplifier stage 30C and the intermediate RF amplifier stage 30B can also cause positive feedback that can destabilize the RF amplification circuit 22(2) and/or introduce distortion if uncorrected. However, as mentioned above, in this embodiment, the inductive element 28A is mutually coupled to the inductive element 28B in opposition. Accordingly, the inductive element 28A and the inductive element 28B are responsive to the electromagnetic field so as to reduce the parasitic magnetic coupling, since the positive feedback between the final RF amplifier stage 30C and the intermediate RF amplifier stage 30B is opposed by the magnetic coupling between the inductive element 28A and the inductive element 28B. The self-inductance of the inductive element 28A and the self-inductance of the inductive element 28B may be provided such that both the parasitic electric coupling and the parasitic magnetic coupling are minimized.

Figure 4:
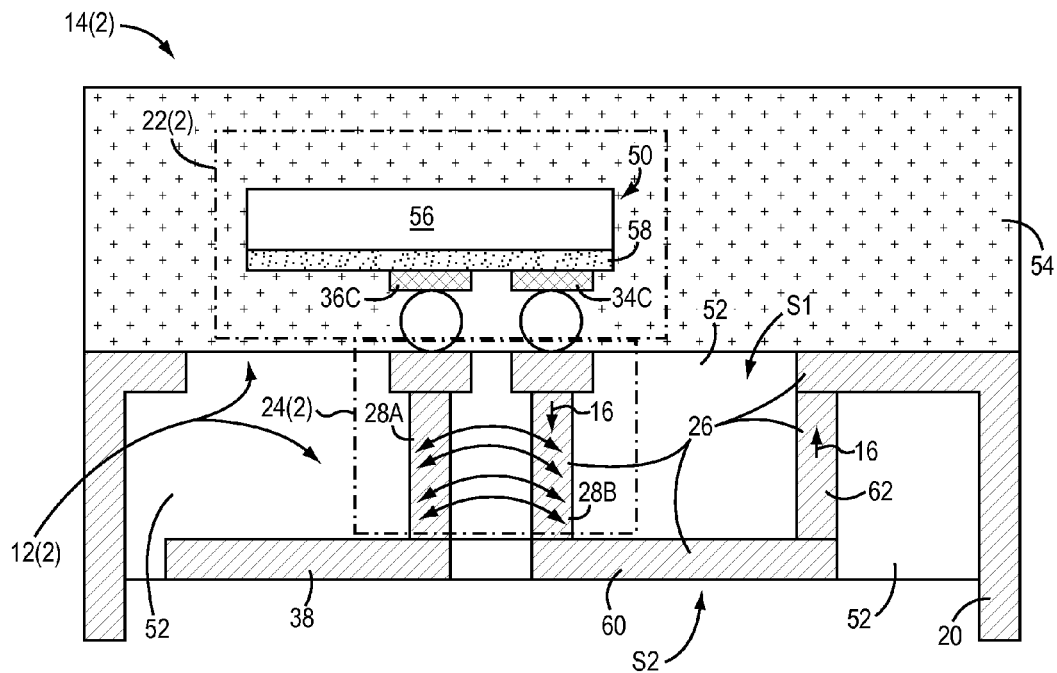
FIG. 4 illustrates one embodiment of a physical layout of the RF amplification device shown in FIG. 3, wherein the grounding element is a grounding via and the connection element is a connection via in a package board.

FIG. 4 illustrates one embodiment of a physical layout of the RF amplification device 12(2) and the IC package 14(2) described above with respect to FIG. 3. As shown in FIG. 4, the RF amplification device 12(2) is integrated into the IC package 14(2). The IC package 14(2) includes a semiconductor die 50, a package board 52, and molding 54. The RF amplification circuit 22(2) is formed by the semiconductor die 50. The semiconductor die 50 includes a semiconductor substrate 56 used to form active semiconductor components of the RF amplification circuit 22(2), which is an IC. The semiconductor substrate 56 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or on a bottom of the semiconductor substrate 56 to provide termini of the active semiconductor components, to form passive impedance elements, and/or the like.

The semiconductor die 50 also includes a Back-End-of-Line (BEOL) 58, which may be formed from a non-conductive substrate and a plurality of metallic layers provided on or in the insulating substrate. The BEOL 58 is configured to couple the components on the semiconductor substrate 56 to one another. Termini may also be provided by the BEOL 58 to provide connections from external components to the IC. The BEOL 58 may also be used to form passive impedance elements.

A topology of the semiconductor die 50 formed by the semiconductor substrate 56 and the BEOL 58 that forms the IC may be in accordance with any suitable semiconductor technology, such as Complementary Metal-On-Oxide Semiconductor (CMOS) technology, BiComplementary Metal-On-Oxide Semiconductor (BiCMOS) technology, Silicon-On-Insulator (SOI) technology, and/or the like. In this embodiment, the topology of the semiconductor die 50 is provided in accordance with CMOS technology, since it is inexpensive, allows the IC to be small, and allows for easy manufacturing. The stabilizing transformer network 24(2) reduces the parasitic distortion in the RF signal path 26 so that the semiconductor die 50 with the RF amplification circuit 22(2) can be provided in accordance with CMOS technology while consuming less area.

In a multi-layer substrate, the inductive elements 28A, 28B may be realized with several vias and corresponding metal structures, oriented vertically, horizontally, or a combination of the two. Vertical orientations may be preferred since they can help minimize distances and parasitic inductances.

The semiconductor die 50 is mounted to the package board 52 within the IC package 14(2). More specifically, the semiconductor die 50 shown in FIG. 4 is mounted on a side S1 of the package board 52. The package board 52 may be formed by a plurality of board layers formed from a non-conductive material and metallic structures formed on or within the plurality of board layers. The semiconductor die 50 is thus mounted vertically on the package board 52 and extends horizontally across the side S1 of the package board 52. The non-conductive material that forms the board layers may be a dielectric, a laminate, fibers, glass, ceramic, and/or the like. The dielectric may be a Silicon Oxide ($SiO_x$). The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like.

The metallic structures of the package board 52 may be used to form termini, conductive paths, passive impedance components, and the like. For instance, the metallic layers are used to form connections between the semiconductor die 50 and the package board 52. Also, although the RF amplification device 12(2) may be provided entirely by the IC formed by the semiconductor die 50, components of the RF amplification device 12(2) may also be formed using the metallic structures in the package board 52, like the stabilizing transformer network 24(2) shown in FIG. 4. The semiconductor die 50 shown in FIG. 4 is encapsulated by the molding 54, which may be formed from a non-conductive material to help insulate the semiconductor die 50 and the RF amplification circuit 22(2). In this manner, the semiconductor die 50 is protected from external electromagnetic noise generated outside the IC package 14(2). The grounding plate 38 is provided as a metallic layer that extends horizontally with respect to the package board 52 of the IC package 14(2). In this embodiment, the grounding plate 38 is provided on a side S2 of the package board 52 that is oppositely disposed to the side S1.

As shown in FIG. 4, the stabilizing transformer network 24(2) is provided by arranging metallic components in the package board 52. In this embodiment, the inductive element 28A is a grounding via that extends vertically through the package board 52 to connect the grounding terminus 36C to the grounding plate 38. The inductive element 28B is provided as a connection via that also extends vertically through the package board 52 and is connected to the amplifier output terminus 34C. The inductive element 28B is disposed within the package board 52 within sufficient proximity so that the inductive element 28B and the inductive element 28A are mutually coupled. Furthermore, the inductive element 28B is oriented such that the propagation of the RF signal 16 along the RF signal path 26 results in opposing magnetic fluxes being generated by the inductive element 28B and the inductive element 28A. As such, the inductive element 28B and the inductive element 28A are mutually coupled in opposition.

In this embodiment, the package output terminus 20 is provided in the IC package 14(2) by a pin. In order to complete a connection path from the amplifier output terminus 34C to the package output terminus 20, a connection strip 60 and a connection via 62 are formed by the metallic structure of the package board 52. The connection strip 60 is connected to the inductive element 28B and extends horizontally at the side S2. The connection strip 60 is connected to the connection via 62, which extends vertically through the package board 52 from the side S2 to the side S1. The connection via 62 is then connected to the package output terminus 20 at the side S1 so that the RF signal 16 is transmitted externally from the IC package 14(2) through the package output terminus 20.

Figure 5:
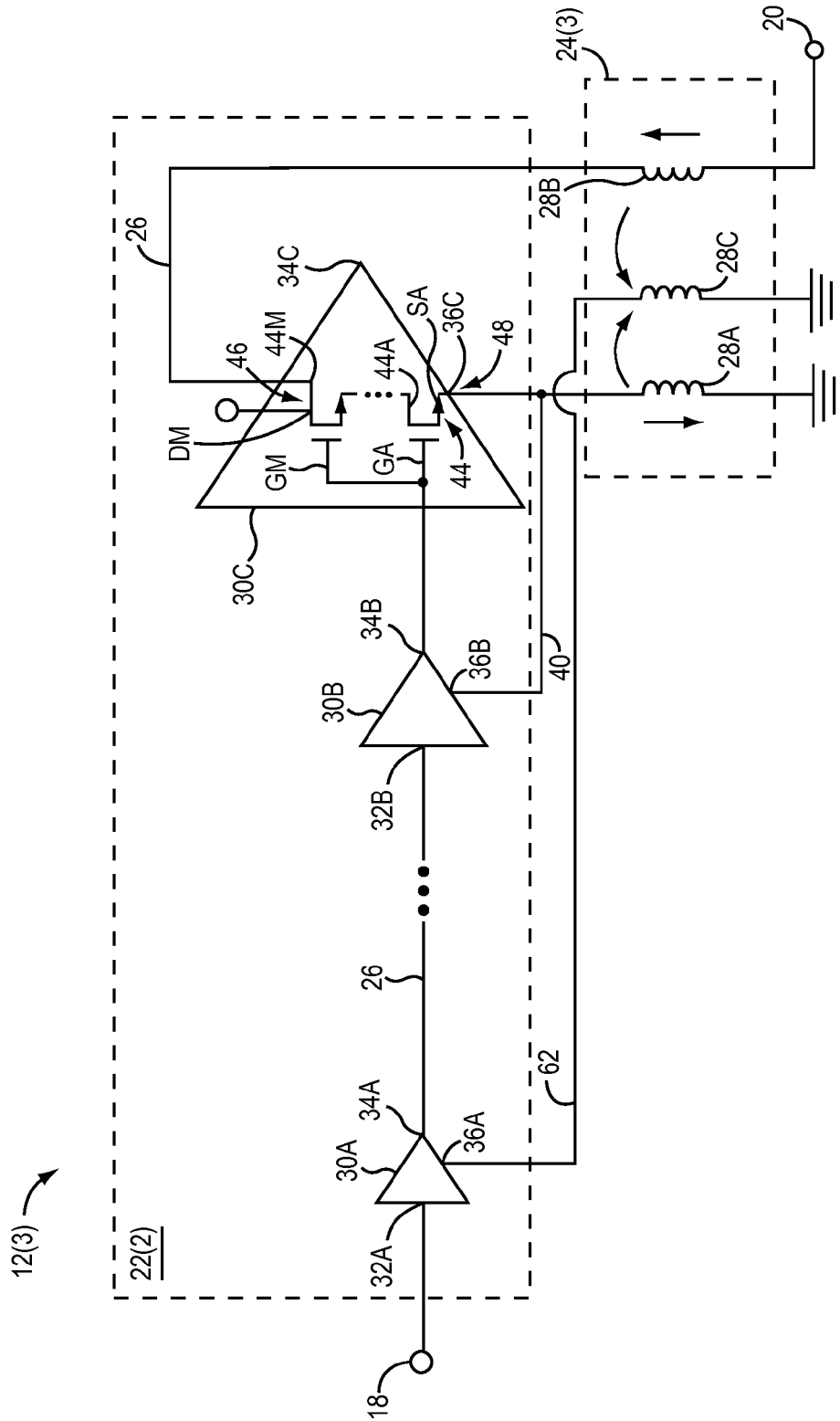
FIG. 5 illustrates another embodiment of an RF amplification device, like the RF amplification device shown in FIG. 3, wherein the stabilizing transformer network further includes a second grounding element connected to the initial RF amplifier stage and connected between the grounding element and the connection element of the final RF amplifier stage.

FIG. 5 illustrates another embodiment of an RF amplification device 12(3). The RF amplification device 12(3) includes the RF amplification circuit 22(2) (described above with respect to FIG. 3) and a stabilizing transformer network 24(3) operably associated with the RF amplification circuit 22(2). The stabilizing transformer network 24(3) shown in FIG. 5 includes the inductive element 28A and the inductive element 28B described above with respect to FIG. 3. However, in this embodiment, the stabilizing transformer network 24(3) further includes an inductive element 28C connected to the grounding terminus 36A of the initial RF amplifier stage 30A. In this embodiment, the inductive element 28C is a grounding element. The connection via 62 connects the inductive element 28C to the grounding terminus 36C of the initial RF amplifier stage 30A so as to provide a shunt path 64 from the RF signal path 26 to ground. The inductive element 28A, the inductive element 28B, and the inductive element 28C are mutually coupled so as to reduce parasitic coupling along the RF signal path 26. In this case, it reduces the parasitic coupling to the ground connection at the initial RF amplifier stage 30A. A similar technique can be used to reduce the parasitic coupling to the package input terminus 18.

In particular, signal reflections at the grounding terminus 36A can cause the amplifier output terminus 34A to be parasitically coupled (i.e., parasitic magnetic coupling) to the amplifier input terminus 32A through the grounding terminus 36A. Additionally, the propagation of the RF signal 16 in the RF signal path 26 may cause the initial RF amplifier stage 30A to be parasitically coupled (i.e., parasitic electric coupling) to the intermediate RF amplifier stage 30B and/or the final RF amplifier stage 30C. In fact, the RF signal path 26 may emit an electromagnetic field that results in parasitic coupling between any of the RF amplifier stages 30 and between any of the amplifier termini, including the amplifier input termini 32A, 32B, and 32C and the amplifier output termini 34A, 34B, 34C. In this regard, the final RF amplifier stage 30C can be particularly problematic due to its power levels. As such, the final RF amplifier stage 30C may be considered an aggressor with regard to the parasitic coupling, while the intermediate RF amplifier stage 30B and the initial RF amplifier stage 30A may be considered victims.

With regard to the stabilizing transformer network 24(3) that corrects for the parasitic coupling, the inductive element 28A and the inductive element 28B are mutually coupled in opposition (as discussed above with regard to FIG. 3). The inductive element 28C of the stabilizing transformer network 24(3) is positioned between the inductive element 28A and the inductive element 28B. For example, the inductive element 28C may be placed along an electromagnetic axis of symmetry (shown in FIG. 9A) between the inductive element 28A and the inductive element 28B. In this manner, as the RF signal 16 propagates through the RF signal path 26, a magnetic flux generated by the inductive element 28A through the inductive element 28C opposes a magnetic flux generated by the inductive element 28B through the inductive element 28C. By mutually coupling the inductive elements 28A and 28B in opposition and by positioning the inductive element 28C between the inductive elements 28A and 28B, the stabilizing transformer network 24(3) is configured to reduce the parasitic coupling between the RF amplifier stages 30.

Figure 6:
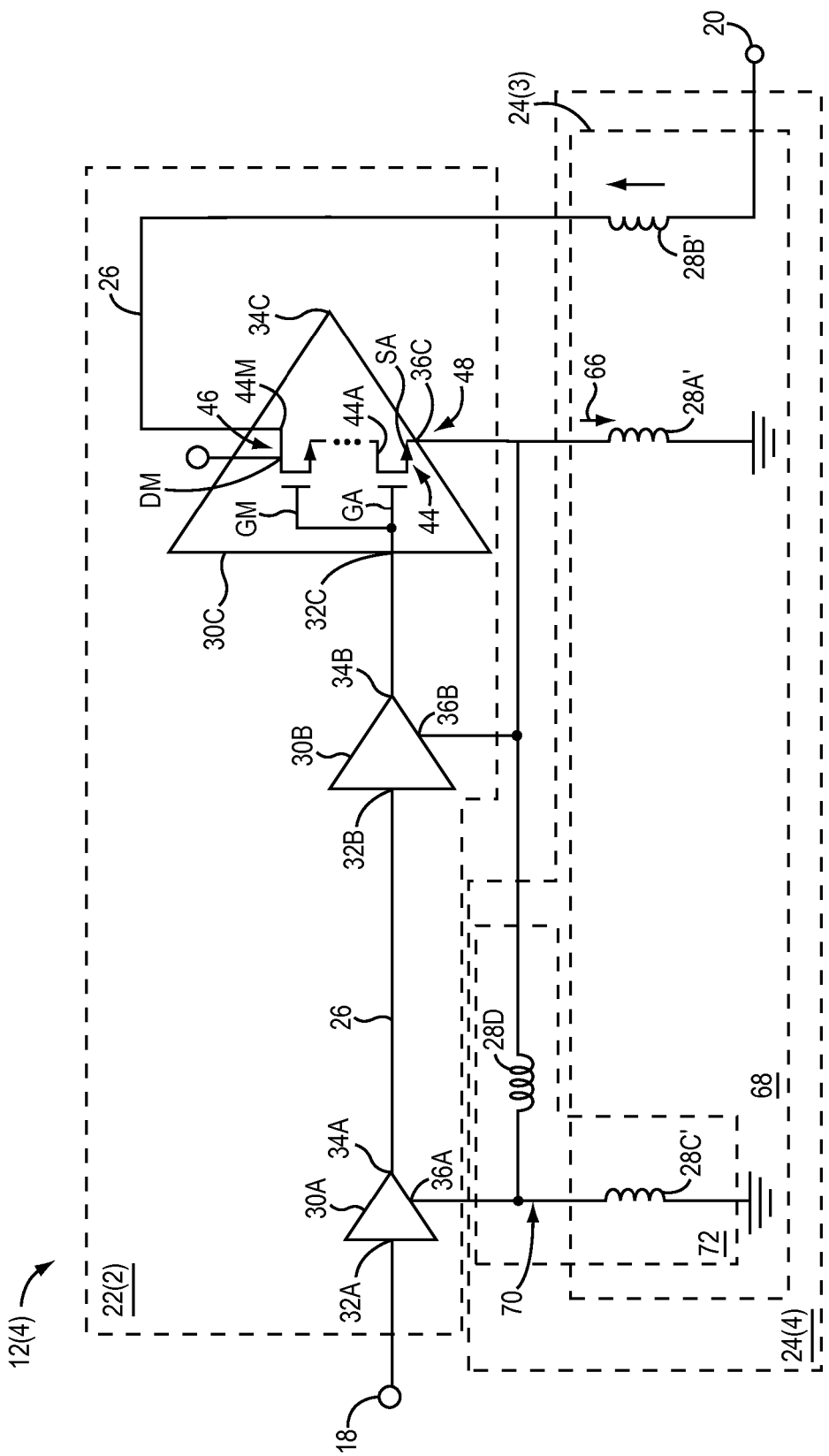
FIG. 6 illustrates another embodiment of an RF amplification device, like the RF amplification device shown in FIG. 3, wherein the stabilizing transformer network includes an autotransformer mutually coupled to a multi-turn transformer network.

FIG. 6 illustrates another embodiment of an RF amplification device 12(4). The RF amplification device 12(4) includes the RF amplification circuit 22(2) (described above with respect to FIG. 3) and a stabilizing transformer network 24(4) operably associated with the RF signal path 26 defined by the RF amplification circuit 22(2). The stabilizing transformer network 24(4) shown in FIG. 6 includes an inductive element 28A', an inductive element 28B', an inductive element 28C', and an inductive element 28D. The inductive element 28A' is connected to both the grounding terminus 36B and the grounding terminus 36C, and the inductive element 28A' provides a common shunt path 66 to ground. Also, like the inductive element 28B shown in FIG. 5, the inductive element 28B' is provided as part of the RF signal path 26. Furthermore, the inductive element 28A' and the inductive element 28B' are mutually coupled in opposition to reduce parasitic coupling. However, in this embodiment, the inductive element 28A', the inductive element 28B', and the inductive element 28C' are each provided as an inductor coil and form a multi-turn transformer 68. The inductive element 28C' is connected to the grounding terminus 36A so as to provide the initial RF amplifier stage 30A with a shunt path 70 to ground. The multi-turn transformer 68 may be non-DC-isolated or DC-isolated. Alternatively, a multi-tap transformer (not shown) may be used. Alternatively, a combination of DC-isolated and non-DC-isolated inductors can be used.

In this embodiment, the inductive element 28C' and the inductive element 28D are mutually coupled and form an autotransformer 72. The inductive element 28D is thus also an inductor coil and is connected between the grounding terminus 36A of the initial RF amplifier stage 30A and the grounding terminus 36B of the intermediate RF amplifier stage 30B. The autotransformer 72 is mutually coupled to the multi-turn transformer 68 so as to reduce parasitic coupling along the RF signal path 26. Using both the autotransformer 72 and the multi-turn transformer 68 may reduce the parasitic coupling along the RF signal path 26 such that the parasitic coupling is substantially cancelled. In alternative embodiments, the inductive elements 28C, 28D may not be mutually coupled to the inductive elements 28A, 28B. In still another embodiment, the inductive element 28C may not be mutually coupled to the inductive element 28D.

Figure 7:
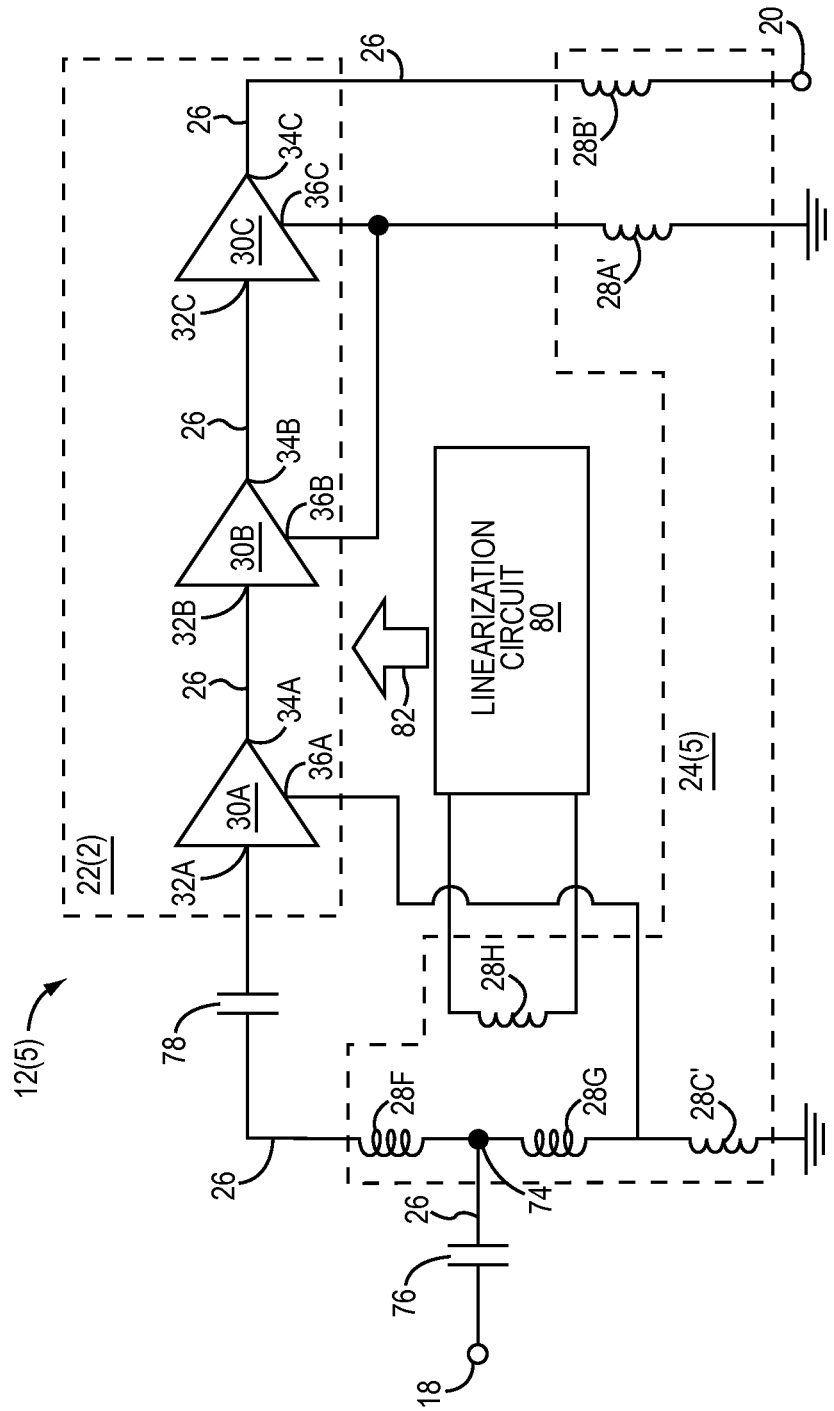
FIG. 7 illustrates another embodiment of an RF amplification device, wherein the stabilizing transformer network includes an inductive element connected to a linearization circuit that receives feedback from the RF amplification circuit described in FIG. 3.

FIG. 7 illustrates another embodiment of an RF amplification device 12(5). The RF amplification device 12(5) includes the RF amplification circuit 22(2) (described above with respect to FIG. 3) and a stabilizing transformer network 24(5) operably associated with the RF amplification circuit 22(2). The stabilizing transformer network 24(4) shown in FIG. 6 includes the inductive element 28A', the inductive element 28B', and the inductive element 28C' described above. However, in this embodiment, the stabilizing transformer network 24(5) further includes an inductive element 28F, an inductive element 28G, and an inductive element 28H. The inductive element 28A', the inductive element 28B', the inductive element 28C', the inductive element 24F, the inductive element 28G, and the inductive element 28H are mutually coupled so as to reduce parasitic coupling along the RF signal path 26 defined by the RF amplification circuit 22(2).

In this embodiment, the inductive element 28F and the inductive element 28G are formed from one inductor coil. A tap 74 defines the inductive element 28F and the inductive element 28G in the inductor coil. The inductive element 28G is connected between the tap 74 and the inductive element 28C' and thus is part of a shunt path to ground. In the RF signal path 26, a capacitor 76 is connected between the package input terminus 18 and the tap 74. A capacitor 78 is connected between the inductive element 28F and the amplifier input terminus 32A.

As shown in FIG. 7, the RF amplification device 12(5) includes a linearization circuit 80. The linearization circuit 80 is configured to receive feedback from the RF amplification circuit 22(2) and linearize a transfer function of the RF amplification circuit 22(2) in response to the feedback. In order to regulate the transfer function, the linearization circuit 80 is configured to generate a control output 82, which is transmitted to the RF amplification circuit 22(2). The control output 82 may include one or more control signals that adjust the transfer function of the linearization circuit 80. The feedback may be received at an input of the RF amplification circuit 22(2) and/or at an output of the RF amplification circuit 22(2). FIG. 7 illustrates that the linearization circuit 80 is connected to the inductive element 28H in order to receive the feedback as input feedback from the input of the RF amplification circuit 22(2). However, another inductive element (not shown) may also be connected to the linearization circuit 80 to receive output feedback at the output of the RF amplification circuit 22(2).

The inductive element 28H is mutually coupled to the inductive element 28F and/or the inductive element 28G in order to receive the feedback. However, the electromagnetic field emitted by the RF amplification circuit 22(2) as the RF signal 16 propagates through the RF signal path 26 may cause parasitic coupling between the inductive element 28F and the RF amplification circuit 22(2). This parasitic coupling can result in noise and/or distortion in the feedback received by the linearization circuit 80, thereby introducing distortion into the RF amplification circuit 22(2). As mentioned above, the inductive element 28A', the inductive element 28B', the inductive element 28C', the inductive element 24F, the inductive element 28G, and the inductive element 28H are mutually coupled (at least some of them are) so as to reduce the parasitic coupling along the RF signal path 26 defined by the RF amplification circuit 22(2). However, in this embodiment, the inductive element 28A', the inductive element 28B', the inductive element 28C', the inductive element 24F, the inductive element 28G, and the inductive element 28H are mutually coupled (at least some of them are) so as to reduce the parasitic coupling between the RF amplification circuit 22(2) and the inductive element 28H. Some of the mutual couplings may be stronger than others. In general, when a compact assembly is used for the RF amplification circuit 22(2), all inductors involved have some amount of mutual coupling. Some couplings may be designed and others may be parasitic.

Figure 8:
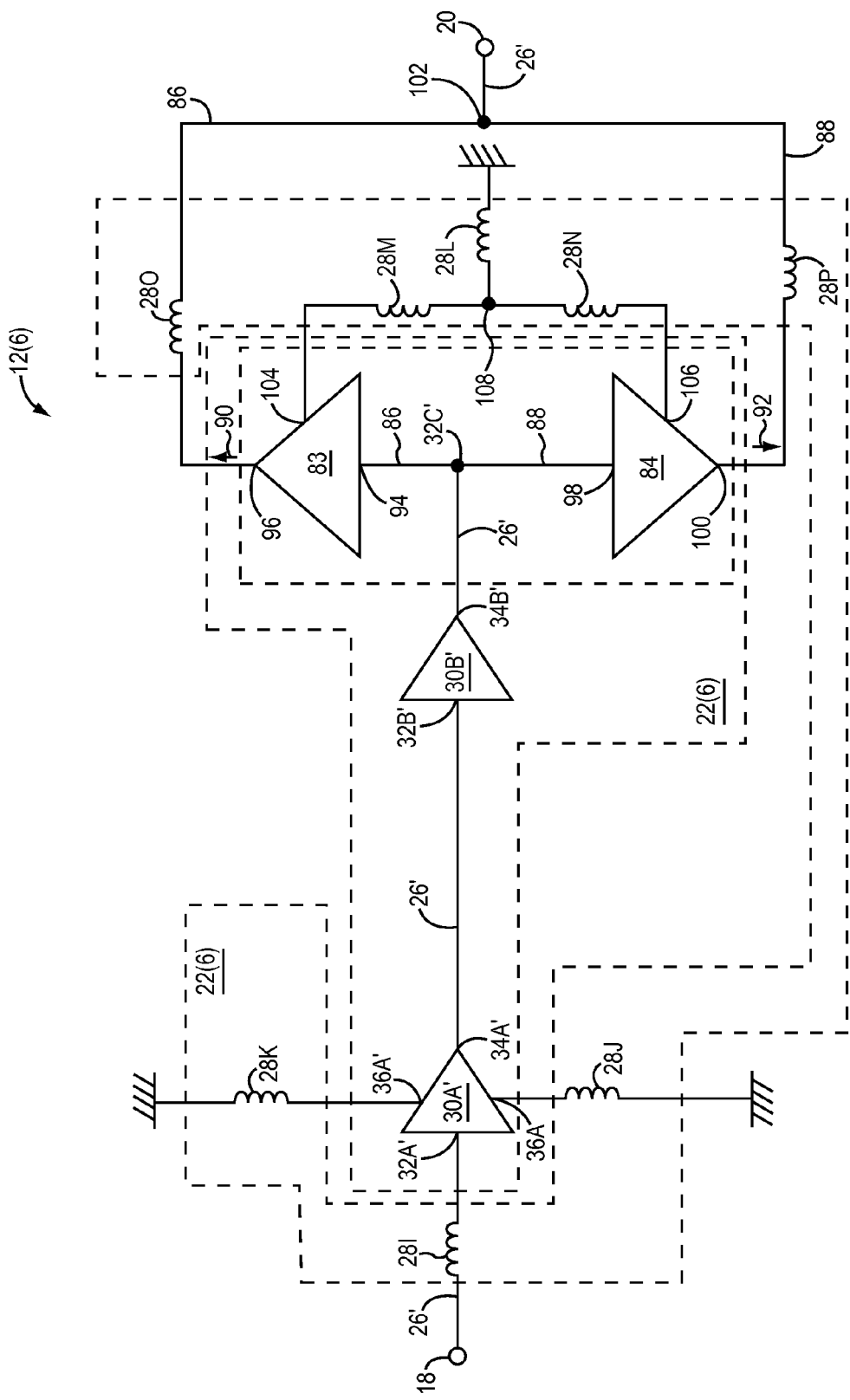
FIG. 8 illustrates another embodiment of an RF amplification device, wherein the RF amplification circuit includes a final RF amplifier stage divided into symmetrical RF amplifier substages.

FIG. 8 illustrates another embodiment of an RF amplification device 12(6). The RF amplification device 12(6) includes an RF amplification circuit 22(3) and a stabilizing transformer network 24(6) operably associated with a RF signal path 26' defined by the RF amplification circuit 22(3). The RF amplification circuit 22(3) shown in FIG. 8 has an initial RF amplifier stage 30A', an intermediate RF amplifier stage 30B', and a final RF amplifier stage 30C' (the initial RF amplifier stage 30A', the intermediate RF amplifier stage 30B', and the final RF amplifier stage 30C' are referred to generically as element 30'). The initial RF amplifier stage 30A' is the RF amplifier stage 30' at a beginning of the sequence within the RF signal path 26'. The final RF amplifier stage 30C' is the RF amplifier stage 30' at an end of the sequence within the RF signal path 26'. The intermediate RF amplifier stage 30B' is coupled within the RF signal path 26' in cascade between the initial RF amplifier stage 30A' and the final RF amplifier stage 30C'.

As shown in FIG. 8, the initial RF amplifier stage 30A' has an amplifier input terminus 32A' and an amplifier output terminus 34A'. The intermediate RF amplifier stage 30B' has an amplifier input terminus 32B' and an amplifier output terminus 34B'. The final RF amplifier stage 30C' has an amplifier input terminus 32C'. However, in this embodiment, the final RF amplifier stage 30C' is a symmetrical amplifier stage having a first RF amplifier substage 83 and a second RF amplifier substage 84. In the final RF amplifier stage 30C', the RF signal path 26 is divided into a first symmetrical subpath 86 and a second symmetrical subpath 88 at the amplifier input terminus 32C'. The first symmetrical subpath 86 includes the first RF amplifier substage 83 and the second symmetrical subpath 88 includes the second RF amplifier substage 84.

At the amplifier input terminus 32C', the RF signal 16 is split into a first RF subsignal 90 that propagates along the first symmetrical subpath 86 and a second RF subsignal 92 that propagates along the second symmetrical subpath 88. The first RF amplifier substage 83 has a subamplifier input terminus 94 and a subamplifier output terminus 96. The first RF amplifier substage 83 is configured to receive the first RF subsignal 90 at the subamplifier input terminus 94 and then amplify the first RF subsignal 90. The first RF subsignal 90 is transmitted from the subamplifier output terminus 96 to the package output terminus 20. Similarly, the second RF amplifier substage 84 has a subamplifier input terminus 98 and a subamplifier output terminus 100. The second RF amplifier substage 84 is configured to receive the second RF subsignal 92 at the subamplifier input terminus 98 and then amplify the second RF subsignal 92. The second RF subsignal 92 is transmitted from the subamplifier output terminus 100 to the package output terminus 20. The first symmetrical subpath 86 and the second symmetrical subpath 88 converge at terminal 102. As a result, the first RF subsignal 90 and the second RF subsignal 92 are combined at the terminal 102 so that the RF signal 16 is transmitted from the final RF amplifier stage 30C' as a single-ended signal to the package output terminus 20. In other embodiments, more than one connection can be placed on the electromagnetic axis of symmetry EA to achieve low parasitic coupling from output terminals.

Using the stabilizing transformer network 24(6), the reduction of parasitic coupling along the RF signal path 26' can be distributed to more inductive elements 28. In this embodiment, the stabilizing transformer network 24(6) shown in FIG. 8 includes an inductive element 28I, an inductive element 28J, an inductive element 28K, an inductive element 28L, an inductive element 28M, an inductive element 28N, an inductive element 28O, and an inductive element 28P. The inductive element 28I, the inductive element 28J, the inductive element 28K, the inductive element 28L, and the inductive element 28M, the inductive element 28N, the inductive element 28O, and the inductive element 28P are mutually coupled so as to reduce parasitic coupling along the RF signal path 26' defined by the RF amplification circuit 22(3). The inductive element 28I is coupled between the package input terminus 18 and the amplifier input terminus 32A', and is thus in the RF signal path 26'. In this embodiment, the initial RF amplifier stage 30A' includes the grounding terminus 36A and a grounding terminus 36A'. The inductive element 28J is connected to the grounding terminus 36A to provide a first shunt path to ground and the inductive element 28K is connected to the grounding terminus 36A' to provide a second shunt path to ground. The first RF amplifier substage 83 includes a grounding terminus 104, while the second RF amplifier substage 84 includes a grounding terminus 106. A grounding terminal 108 is connected to the inductive element 28L so as to provide a common shunt path to ground. The inductive element 28M is connected between the grounding terminus 104 and the grounding terminal 108 to connect to the common shunt path. The inductive element 28N is connected between the grounding terminus 106 and the grounding terminal 108 to connect to the common shunt path. The inductive element 28O is in the first symmetrical subpath 86 and is connected between the subamplifier output terminus 96 and the terminal 102. The inductive element 28P is in the second symmetrical subpath 88 and is connected between the subamplifier output terminus 100 and the terminal 102. The terminal 102 is connected to the package output terminus 20.

The inductive elements 28 of the stabilizing transformer network 24(6) shown in FIG. 8 are arranged symmetrically (see FIG. 9B) so that the electromagnetic field generated as the RF signal 16 propagates along the RF signal path 26' results in a reduction of the parasitic coupling along the RF signal path 26'. This allows for better cancellation of the parasitic coupling. In particular, the inductive elements 28J and 28K are each mutually coupled to the inductive element 28L where the inductive elements 28J and 28K are symmetrically positioned so that the mutual coupling is in opposition. Similarly, the inductive element 28I is mutually coupled to the inductive elements 28M, 28N, 28O, and 28P. The inductive elements 28M and 28O are symmetrically positioned with respect to the inductive elements 28N and 28P such that the mutual coupling between the inductive element 28I and the inductive elements 28M, 28O is in opposition to the mutual coupling between the inductive element 28I and the inductive elements 28N and 28P. In this manner, symmetrical positioning of the inductive elements 28 helps to reduce parasitic coupling along the RF signal path 26'.

FIG. 9A illustrates one embodiment of a semiconductor die 50A, like the semiconductor die 50 described above with respect to FIG. 4. In this embodiment, the RF amplification circuit 22(2) (shown in FIG. 5) has been formed with the semiconductor die 50A in order to connect to a package board (not shown), like the package board 52 described above with respect to FIG. 4. The package board includes the inductive elements 28A, 28B, 28C of the stabilizing transformer network 24(3) described above with respect to FIG. 5. The semiconductor die 50A is a flip-chip-type semiconductor die and FIG. 9A illustrates a BEOL 58A (like the BEOL 58 shown in FIG. 4) of the semiconductor die 50A as viewed from a connection side of the semiconductor die 50A.

The BEOL 58A includes one embodiment of the grounding terminus 36A, the grounding terminus 36C, and the amplifier output terminus 34C, which in this embodiment are contact pads in the BEOL 58A. Note that the inductive elements 28C, 28A, and 28B shown in FIG. 5 are positioned in the package board at positions that correspond to positions of the grounding terminus 36A, the grounding terminus 36C, and the amplifier output terminus 34C, respectively, in the BEOL 58A. The grounding terminus 36A, the grounding terminus 36C, and the amplifier output terminus 34C are aligned symmetrically about an electromagnetic axis of symmetry EA. The grounding terminus 36A is on the electromagnetic axis of symmetry EA and thus a projection of a position P1 of the grounding terminus 36A is approximately at position 110 on the electromagnetic axis of symmetry EA, where the position P1 and the position 110 are approximately the same. The grounding terminus 36C and the amplifier output terminus 34C are not on the electromagnetic axis of symmetry EA. However, the grounding terminus 36C and the amplifier output terminus 34C are aligned transversely relative to the electromagnetic axis of symmetry EA such that projections of each of their positions P2, P3 are approximately at position 112 on the electromagnetic axis of symmetry EA. The positions P2, P3 are also approximately symmetrical relative to the electromagnetic axis of symmetry EA. Furthermore, the grounding terminus 36A is symmetrically positioned between the grounding terminus 36C and the amplifier output terminus 34C. By analogy, within the package board, the inductive element 28A (shown in FIG. 5) is symmetrically positioned between the inductive elements 28A and 28B (shown in FIG. 5) with respect to the electromagnetic axis of symmetry EA in order to reduce parasitic coupling. A distance D1 is a displacement along the electromagnetic axis of symmetry EA between the position 110 and the position 112. The distance D1 may be relatively small in compact structures and should be greater than a particular distance limit to help ensure system stability.

FIG. 9B illustrates one embodiment of a semiconductor die 50B, similar to the semiconductor die 50 described above with respect to FIG. 4. In this embodiment, the RF amplification circuit 22(3) (shown in FIG. 8) has been formed with the semiconductor die 50B in order to connect to a package board (not shown), similar to the package board 52 described above with respect to FIG. 4. The package board includes the inductive element 28I, the inductive element 28J, the inductive element 28K, the inductive element 28L, the inductive element 28M, the inductive element 28N, the inductive element 28O, and the inductive element 28P of the stabilizing transformer network 24(6) described above with respect to FIG. 8. Like the semiconductor die 50A (shown in FIG. 9A), the semiconductor die 50B is a flip-chip-type semiconductor die and FIG. 9B illustrates a BEOL 58B (similar to the BEOL 58 shown in FIG. 4) of the semiconductor die 50B as viewed from a connection side of the semiconductor die 50B.

The BEOL 58B includes one embodiment of the amplifier input terminus 32A', the grounding terminus 36A, the grounding terminus 36A', the subamplifier output terminus 96, the subamplifier output terminus 100, the grounding terminus 104, and the grounding terminus 106, which in this embodiment are contact pads on the connection side of the BEOL 58B. Note that the inductive element 28I (shown in FIG. 8), the inductive element 28J (shown in FIG. 8), the inductive element 28K (shown in FIG. 8), the inductive element 28M (shown in FIG. 8), the inductive element 28N (shown in FIG. 8), the inductive element 28O (shown in FIG. 8), and the inductive element 28P (shown in FIG. 8) are positioned in the package board at positions that correspond to positions of the amplifier input terminus 32A', the grounding terminus 36A, the grounding terminus 36A', the grounding terminus 104, and the grounding terminus 106, the subamplifier output terminus 96, and the subamplifier output terminus 100, respectively, in the BEOL 58B. With respect to this embodiment of the inductive element 28L (shown in FIG. 8), the inductive element 28L is entirely within the package board and does not connect to the BEOL 58B. However, a locale L1 indicates the position of the inductive element 28L relative to the amplifier input terminus 32A', the grounding terminus 36A, the grounding terminus 36A', the grounding terminus 104, the grounding terminus 106, the subamplifier output terminus 96, and the subamplifier output terminus 100, and thus also relative to the inductive element 28I, the inductive element 28J, the inductive element 28K, the inductive element 28M, the inductive element 28N, the inductive element 28O, and the inductive element 28P within the package board. The amplifier input terminus 32A', the grounding terminus 36A, the grounding terminus 36A', the subamplifier output terminus 96, the subamplifier output terminus 100, the grounding terminus 104, and the grounding terminus 106 are aligned symmetrically about an electromagnetic axis of symmetry EA'. With regard to the initial RF amplifier stage 30A' (shown in FIG. 8), the amplifier input terminus 32A' is on the electromagnetic axis of symmetry EA', and thus a projection of a position P1' of the grounding terminus 36A is approximately at position 114 on the electromagnetic axis of symmetry EA'. The grounding terminus 36C and the amplifier output terminus 34C are not on the electromagnetic axis of symmetry EA'. However, the grounding terminus 36A and the amplifier output terminus 34A' are aligned such that projections of each of their positions P2', P3' are approximately at the position 114 on the electromagnetic axis of symmetry EA'. Thus, the positions P2', P3' are also approximately symmetrical relative to the electromagnetic axis of symmetry EA'. In other embodiments, multiple victim termini can be placed on the electromagnetic axis of symmetry EA, or split into two termini placed symmetrically around the electromagnetic axis of symmetry EA'.

With regard to the final RF amplifier stage 30C' (shown in FIG. 8), the locale L1 is on the electromagnetic axis of symmetry EA', and thus a projection of a position P4 the locale L1 is approximately at position 116 on the electromagnetic axis of symmetry EA'. The grounding terminus 104 and the grounding terminus 106 are not on the electromagnetic axis of symmetry EA'. However, the grounding terminus 104 and the grounding terminus 106 are aligned such that projections of each of their positions P5, P6 are approximately at the position 116 on the electromagnetic axis of symmetry EA'. The positions P5, P6 are also approximately symmetrical relative to the electromagnetic axis of symmetry EA'. Additionally, the subamplifier output terminus 96 and the subamplifier output terminus 100 are also not on the electromagnetic axis of symmetry EA' but are placed symmetrically with respect to the electromagnetic axis of symmetry EA'. However, the subamplifier output terminus 96 and the subamplifier output terminus 100 are aligned such that projections of each of their positions P7, P8 are approximately at the position 116 on the electromagnetic axis of symmetry EA'. The positions P7, P8 are also approximately symmetrical relative to the electromagnetic axis of symmetry EA'.

By analogy, within the package board, the inductive elements 28I-28K (shown in FIG. 8) are symmetrically positioned between the inductive elements 28I-28P (shown in FIG. 8) with respect to the electromagnetic axis of symmetry EA' so as to reduce parasitic coupling. A distance D2 is a displacement along the electromagnetic axis of symmetry EA' between the position 114 and the position 116. As such, the inductive elements 28M and 28O are symmetrically positioned with respect to the inductive elements 28N and 28P such that mutual coupling between the inductive elements 28I and 28J and the inductive elements 28M and 28L is in opposition to the mutual coupling between the inductive element 28I and 28J and the inductive elements 28L, 28N, and 28P. A distance D2 is a displacement along the electromagnetic axis of symmetry EA' between the position 114 and the position 116. The distance D2 may be relatively small in compact structures and should be greater than a particular distance limit to help ensure system stability. An isolation wall 118 is provided to further reduce the parasitic coupling. As such, the isolation wall 118 allows for a decrease in the distance D2.

In other embodiments, an output terminus can be split for more than two subsignals and placed symmetrically versus the electromagnetic axis of symmetry EA'. For example, the final RF amplifier stage 30C (i.e., the aggressor stage) can have the amplifier output terminus 32C split into two differential terminals. Thus, the final RF amplifier stage 30C may be provided as a differential amplifier stage. The stabilizing transformer network 24 (shown in FIG. 1) can be realized for use with the differential amplifier stage. The same is true for quadrature amplifiers.

Those skilled in the art will recognize improvements and modifications to the embodiments of the present disclosure. All such improvements and modifications are considered within the scope of the concepts disclosed herein and the claims that follow.

What is claimed is:

1. A radio frequency (RF) amplification device, comprising:
    an RF amplification circuit that defines an RF signal path, wherein the RF amplification circuit is configured to amplify an RF signal propagating in the RF signal path, wherein the RF amplification circuit comprises:
        an initial RF amplifier stage;
        an intermediate RF amplifier stage; and
        a final RF amplifier stage having a first grounding terminus, wherein the initial RF amplifier stage, the intermediate RF amplifier stage, and the final RF amplifier stage are connected in cascade so as to provide amplification to the RF signal in sequence; and
a stabilizing transformer network operably associated with the RF signal path, wherein the stabilizing transformer network is configured to reduce parasitic coupling along the RF signal path of the RF amplification circuit as the RF signal propagates in the RF signal path, wherein the stabilizing transformer network comprising:
a grounding element connected to the first grounding terminus of the final RF amplifier stage so as to provide a shunt path to ground; and
a connection element connected within the RF signal path, wherein the grounding element and the connection element are mutually coupled in opposition so as to reduce the parasitic coupling within the RF signal path.

2. The RF amplification device of claim 1, wherein the stabilizing transformer network comprises a plurality of inductive elements operably associated with the RF signal path, wherein the plurality of inductive elements is mutually coupled so as to reduce the parasitic coupling along the RF signal path of the RF amplification circuit as the RF signal propagates in the RF signal path.

3. The RF amplification device of claim 1, wherein:
the RF signal path is operable to emit an electromagnetic field that results in the parasitic coupling including parasitic magnetic coupling along the RF signal path as the RF signal propagates in the RF signal path; and
the stabilizing transformer network is responsive to the electromagnetic field so as reduce the parasitic magnetic coupling along the RF signal path.

4. The RF amplification device of claim 1, wherein:
the RF signal path is operable to produce results in signal reflections such that the parasitic coupling results in parasitic electric coupling along the RF signal path as the RF signal propagates in the RF signal path; and
the stabilizing transformer network is configured so as to set one or more impedances presented along the RF signal path so as to decrease the parasitic electric coupling along the RF signal path.

5. The RF amplification device of claim 1 wherein the RF amplification circuit comprises a plurality of RF amplifier stages within the RF signal path.

6. The RF amplification device of claim 5 wherein the stabilizing transformer network is configured to reduce the parasitic coupling between the RF amplifier stages in the plurality of RF amplifier stages.

7. The RF amplification device of claim 1 wherein the stabilizing transformer network
wherein the grounding element and the connection element are mutually coupled in opposition so as to reduce the parasitic coupling within the RF signal path.

8. The RF amplification device of claim 7 wherein:
the RF amplification circuit comprises a first RF amplifier stage connected within the RF signal path and configured to amplify the RF signal, wherein the first RF amplifier stage has a first grounding terminus; and
the first grounding terminus is connected to the grounding element.

9. The RF amplification device of claim 8 further comprising a connection path wherein:
the RF amplification circuit further comprises a second RF amplifier stage connected within the RF signal path and configured to amplify the RF signal, wherein the second RF amplifier stage has a second grounding terminus; and
the connection path is configured to connect the second grounding terminus to the grounding element.

10. The RF amplification device of claim 1 wherein the final RF amplifier stage further comprises a first amplifier input terminus within the RF signal path and a first amplifier output terminus within the RF signal path, and wherein:
the final RF amplifier stage is configured to:
receive the RF signal at the first amplifier input terminus;
amplify the RF signal; and
transmit the RF signal from the first amplifier output terminus once the RF signal has been amplified by the final RF amplifier stage; and
the connection element is connected to the first amplifier output terminus within the RF signal path.

11. The RF amplification device of claim 1 wherein:
the initial RF amplifier stage comprises a second grounding terminus; and
the stabilizing transformer network further comprises a second grounding element connected between the second grounding terminus and ground, wherein the second grounding element is positioned between the connection element and the grounding element such that mutual coupling between the grounding element and the second grounding element and mutual coupling between the second grounding element and the connection element are in opposition.

12. The RF amplification device of claim 1 wherein the RF amplification device is integrated into an integrated circuit (IC) package comprising a semiconductor die and a package board, wherein the semiconductor die is mounted to the package board.

13. The RF amplification device of claim 12, wherein:
the RF amplification circuit is formed by the semiconductor die;
the grounding element comprises a grounding via in the package board; and
the connection element comprises a connection via in the package board.

14. The RF amplification device of claim 13 wherein the stabilizing transformer network comprises:
a multi-turn transformer; and
an autotransformer, wherein the multi-turn transformer is directly coupled to the autotransformer and not mutually coupled to the autotransformer.

15. The RF amplification device of claim 1 wherein the stabilizing transformer network comprises:
a multi-turn transformer; and
an autotransformer, wherein the multi-turn transformer is mutually coupled to the autotransformer so as to reduce the parasitic coupling along the RF signal path.

16. The RF amplification device of claim 1 wherein the RF amplification circuit further comprises:
a grounding element connected to the first grounding terminus of the final RF amplifier stage so as to provide a shunt path to ground; and
a connection element connected within the RF signal path, wherein the grounding element and the connection element are mutually coupled in opposition so as to reduce the parasitic coupling within the RF signal path.

17. The RF amplification device of claim 1 further comprising a linearization circuit and an inductive element, wherein:
the linearization circuit is configured to receive feedback from the RF amplification circuit at the inductive element; and
the stabilizing transformer network includes the inductive element, wherein the inductive element is mutually coupled with the stabilizing transformer network so as to reduce noise in the feedback from the RF amplification circuit.

18. The RF amplification device of claim 1 wherein:
the RF amplification circuit comprises an aggressor stage; and
the aggressor stage is split into two or more aggressor subblocks placed symmetrically versus an electromagnetic axis of symmetry.

19. The RF amplification device of claim 18 wherein:
the RF amplification circuit further comprises a victim stage, wherein a sensitive connection of the victim stage is placed on the electromagnetic axis of symmetry of the aggressor stage; and
the stabilizing transformer network comprises a multi-turn transformer network configured to reduce the parasitic coupling.

20. The RF amplification device of claim 18 wherein:
the RF amplification circuit further comprises a victim stage, wherein a sensitive connection of the victim stage is placed on the electromagnetic axis of symmetry of the aggressor stage; and
the victim stage is split into two or more victim subblocks for two or more subsignals, the subblocks being placed symmetrically versus the electromagnetic axis of symmetry.

21. The RF amplification device of claim 1 wherein the RF amplification circuit comprises multiple aggressor stages.

22. The RF amplification device of claim 1 wherein the RF amplification circuit comprises multiple victim stages.

23. The RF amplification device of claim 1 further comprising multiple substrates wherein:
the RF amplification circuit comprises multiple aggressor stages;
the RF amplification circuit comprises multiple victim stages; and
the RF amplification circuit is formed on the multiple substrates.

24. The RF amplification device of claim 1, wherein the stabilizing transformer network is operably associated with the RF amplification circuit such that some sensitive signals propagate on an electromagnetic axis of symmetry and other sensitive signals propagate symmetrically versus the electromagnetic axis of symmetry.

25. A method of providing amplification to a radio frequency (RF) signal, comprising:
amplifying the RF signal propagating in an RF signal path; and
reducing parasitic coupling along the RF signal path of an RF amplification circuit as the RF signal propagates in the RF signal path with a stabilizing transformer network, wherein:
the RF amplification circuit comprises:
an initial RF amplifier stage;
an intermediate RF amplifier stage; and
a final RF amplifier stage having a first grounding terminus, wherein the initial RF amplifier stage, the intermediate RF amplifier stage, and the final RF amplifier stage are connected in cascade so as to provide amplification to the RF signal in sequence;
the stabilizing transformer network comprises:
a grounding element connected to the first grounding terminus of the final RF amplifier stage so as to provide a shunt path to ground; and
a connection element connected within the RF signal path, wherein the grounding element and the connection element are mutually coupled in opposition so as to reduce the parasitic coupling within the RF signal path.

26. The method of claim 25, wherein the stabilizing transformer network comprises a plurality of inductive elements operably associated with the RF signal path, wherein the plurality of inductive elements is mutually coupled so as to reduce the parasitic coupling along the RF signal path of the RF amplification circuit as the RF signal propagates in the RF signal path.

27. The method of claim 25, wherein:
emitting an electromagnetic field that results in the parasitic coupling including parasitic magnetic coupling along the RF signal path as the RF signal propagates in the RF signal path; and
responding to the electromagnetic field with the stabilizing transformer network so as reduce the parasitic magnetic coupling along the RF signal path.

28. The method of claim 25, wherein:
producing results in signal reflections such that the parasitic coupling results in parasitic capacitive coupling along the RF signal path as the RF signal propagates in the RF signal path; and
setting one or more impedances presented along the RF signal path with the stabilizing transformer network so as to decrease the parasitic capacitive coupling along the RF signal path.

* * * * *